US011450335B2

(12) United States Patent
Zhou et al.

(10) Patent No.: US 11,450,335 B2
(45) Date of Patent: Sep. 20, 2022

(54) METHOD AND DEVICE FOR UPDATING COEFFICIENT VECTOR OF FINITE IMPULSE RESPONSE FILTER

(71) Applicant: CHINA ACADEMY OF TELECOMMUNICATIONS TECHNOLOGY, Beijing (CN)

(72) Inventors: Xuan Zhou, Beijing (CN); Min Liang, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 132 days.

(21) Appl. No.: 16/978,644

(22) PCT Filed: Feb. 27, 2019

(86) PCT No.: PCT/CN2019/076259
§ 371 (c)(1),
(2) Date: Sep. 4, 2020

(87) PCT Pub. No.: WO2019/170020
PCT Pub. Date: Sep. 12, 2019

(65) Prior Publication Data
US 2020/0411029 A1 Dec. 31, 2020

(30) Foreign Application Priority Data
Mar. 9, 2018 (CN) .......................... 201810194544.4

(51) Int. Cl.
*G10L 21/0232* (2013.01)
*G10L 25/21* (2013.01)
(Continued)

(52) U.S. Cl.
CPC .......... *G10L 21/0232* (2013.01); *G10L 25/21* (2013.01); *G10L 25/51* (2013.01);
(Continued)

(58) Field of Classification Search
CPC ..... G10L 21/0232; G10L 25/21; G10L 25/51; G10L 2021/02082; G10L 2021/02163;
(Continued)

(56) References Cited

U.S. PATENT DOCUMENTS

| 7,072,465 B1 * | 7/2006 | Benesty | H04B 3/234 |
| | | | 379/406.05 |
| 9,036,816 B1 * | 5/2015 | Ayrapetian | H04M 9/082 |
| | | | 379/406.13 |

(Continued)

FOREIGN PATENT DOCUMENTS

| CN | 101277103 A | 10/2008 |
| CN | 103680515 A | 3/2014 |

(Continued)

OTHER PUBLICATIONS

First Office Action and Search Report from CN app. No. 201810194544.4, dated Jan. 2, 2020, with English translation from Global Dossier.

(Continued)

*Primary Examiner* — Xu Mei
(74) *Attorney, Agent, or Firm* — Ladas & Parry, LLP

(57) ABSTRACT

A method and a device for updating a coefficient vector of a finite impulse response filter are provided. The update method includes: obtaining an updated step-size diagonal matrix for a coefficient vector of the FIR filter; and obtaining an updated coefficient vector of the FIR filter based on the updated step-size diagonal matrix.

20 Claims, 3 Drawing Sheets

(51) Int. Cl.
*G10L 25/51* (2013.01)
*H03H 17/02* (2006.01)
*H03H 17/06* (2006.01)
*H03H 21/00* (2006.01)
*H04R 3/02* (2006.01)
*H04R 29/00* (2006.01)
*G06F 30/23* (2020.01)
*G10L 21/0208* (2013.01)
*G10L 21/0216* (2013.01)

(52) U.S. Cl.
CPC ...... *H03H 17/0227* (2013.01); *H03H 17/065* (2013.01); *H03H 21/0043* (2013.01); *H04R 3/02* (2013.01); *H04R 29/004* (2013.01); *G06F 30/23* (2020.01); *G10L 2021/02082* (2013.01); *G10L 2021/02163* (2013.01); *H03H 2021/0061* (2013.01); *H03H 2021/0078* (2013.01)

(58) Field of Classification Search
CPC ............. H03H 17/0227; H03H 17/065; H03H 21/0043; H03H 2021/0061; H03H 17/0219; H03H 17/0223; H03H 2017/0081; H03H 2017/0244; H03H 2021/0063; H03H 2021/0076; H03H 2021/0078; H04R 3/02; H04R 29/004; G06F 30/23; H04M 9/00; H04M 9/08; H04M 9/082
USPC ........... 381/66; 708/322; 379/406.08, 406.09
See application file for complete search history.

(56) References Cited

U.S. PATENT DOCUMENTS

| | | | |
|---|---|---|---|
| 10,720,138 B2* | 7/2020 | Zhou | G10K 11/17881 |
| 10,880,440 B2* | 12/2020 | Weruaga | H04M 9/082 |
| 2005/0053125 A1 | 3/2005 | Balamurugan et al. | |
| 2005/0147235 A1* | 7/2005 | Telukuntla | H04M 9/082 |
| | | | 379/406.01 |
| 2008/0250090 A1 | 10/2008 | Eitel | |
| 2012/0106357 A1* | 5/2012 | Zummo | H04L 41/145 |
| | | | 370/242 |
| 2014/0112488 A1 | 4/2014 | Kim et al. | |
| 2017/0142532 A1 | 5/2017 | Pan | |
| 2020/0411029 A1 | 12/2020 | Zhou et al. | |

FOREIGN PATENT DOCUMENTS

| | | |
|---|---|---|
| CN | 103718538 A | 4/2014 |
| CN | 103780998 A | 5/2014 |
| CN | 107749304 A | 3/2018 |
| CN | 108390663 A | 8/2018 |
| JP | 4581114 B2 | 11/2010 |

OTHER PUBLICATIONS

International Search Report from PCT/CN2019/076259, dated May 15, 2019, with English translation from WIPO.

Written Opinion of the International Searching Authority from PCT/CN2019/076259, dated May 15, 2019, with English translation from WIPO.

International Preliminary Report on Patentability from PCT/CN2019/076255 dated Sep. 15, 2020, with English translation from WIPO.

* cited by examiner

METHOD AND DEVICE FOR UPDATING COEFFICIENT VECTOR OF FINITE IMPULSE RESPONSE FILTER

CROSS-REFERENCE TO RELATED APPLICATIONS

This application is the U.S. national phase of PCT Application No. PCT/CN2019/076259 filed on Feb. 27, 2019, which claims a priority to Chinese Patent Application No. 201810194544.4 filed on Mar. 9, 2018, the disclosures of which are incorporated in their entireties by reference herein.

TECHNICAL FIELD

The present disclosure relates to the technical field of voice signal processing, and in particular to a method and a device for updating a coefficient vector of a finite impulse response filter.

BACKGROUND

Acoustic echo cancellation (acoustic echo cancellation, AEC) is generally for cancelling an acoustic echo signal that is coupled to a pickup microphone from a loudspeaker, so that the system can implement full duplex (Full duplex) voice communication, thereby providing a better calling experience for a user. In AEC in the related technologies, a normalized least mean square (Normalized LMS, NLMS) algorithm is usually adopted to adaptively update coefficients of its finite impulse response (Finite Impulse Response, FIR) filter. However, the algorithm has a relatively slow convergence rate for a non-stationary voice signal.

It is noted that room impulse response of a room usually has the following feature: impulse response samples attenuate exponentially along the time axis, and changes among these impulse response samples have the same exponential attenuation rate. This feature makes expected errors of all coefficients of the FIR filter gradually decrease with the same exponential attenuation rate as the serial number of the coefficient increases. This statistical feature is integrated into the NLMS algorithm, to propose an exponentially weighted step-size (exponentially weighted step-size, ES) NLMS algorithm (referred to as ES-NLMS algorithm hereinafter). The ES-NLMS algorithm in the related technologies can simulate the room impulse response to a certain extent and thus the convergence rate of the algorithm is increased. However, parameters $\alpha_0$ and $\gamma$ of the step-size diagonal matrix in the algorithm are pre-defined based on empirical values, and the room impulse response constantly changes with its surroundings during the call. As a result, the step-size diagonal matrix that is pre-defined based on the empirical values cannot track the time-varying characteristic of the room impulse response in time, which causes the algorithm to have a degraded performance and a decreased convergence rate.

SUMMARY

Embodiments of the present disclosure provide a method and a device for updating a coefficient vector of a finite impulse response filter to solve the problem that: the room impulse response constantly changing with its surroundings during the call causes the step-size diagonal matrix in the ES-NLMS algorithm which is pre-defined based on the empirical values to be incapable of tracking the time-varying characteristic of the room impulse response in time, thus resulting in a degraded performance and a decreased convergence rate of the algorithm.

To address the above technical problem, embodiments of the present disclosure provide a method for updating a coefficient vector of a finite impulse response (FIR) filter, including:

obtaining an updated step-size diagonal matrix for a coefficient vector of the FIR filter; and obtaining, based on the updated step-size diagonal matrix, an updated coefficient vector of the FIR filter.

Further, the obtaining the updated step-size diagonal matrix for the coefficient vector of the FIR filter includes:

updating, based on an end moment of pre-learning and a pre-defined updating period, a step-size diagonal matrix used to update the coefficient vector of the FIR filter, to obtain the updated step-size diagonal matrix.

Further, the updating, based on the end moment of the pre-learning and the pre-defined updating period, the step-size diagonal matrix used to update the coefficient vector of the FIR filter, to obtain the updated step-size diagonal matrix, includes:

obtaining, a coefficient vector of the FIR filter at an updating moment of the step-size diagonal matrix;

obtaining, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and obtaining, based on the estimated value of the attenuation factor, an updated step-size diagonal matrix of the ES-NLMS algorithm at the updating moment of the step-size diagonal matrix.

Further, in a case that the updating moment is the end moment of the pre-learning, the obtaining the coefficient vector of the FIR filter at the updating moment of the step-size diagonal matrix includes: obtaining, the coefficient vector of the FIR filter at the end moment of the pre-learning, according to the following formula $$\vec{h}(k+1) = \vec{h}(k) + \alpha \frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\alpha$ is a learning rate constant, and $0<\alpha<2$; $e(k)$ is an error signal at the $k^{th}$ moment; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)=y(k)-\hat{y}(k)+n(k)$; $y(k)$ is an echo signal; $\hat{y}(k)$ is an estimation of the echo signal; $n(k)$ is an ambient noise signal received by a microphone; $\delta(k)$ is a time-varying regularization factor; $(k+1)$ is a time index of a signal sample at the end moment of the pre-learning.

Further, in a case that the updating moment is a moment corresponding to the pre-defined updating period of the step-size diagonal matrix after the pre-learning is ended, the obtaining the coefficient vector of the FIR filter at the updating moment of the step-size diagonal matrix includes: obtaining, the coefficient vector of the FIR filter at the moment corresponding to the pre-defined updating period of the step-size diagonal matrix after the pre-learning is ended, according to the following formula $$\vec{h}(k+1) = \vec{h}(k) + \hat{A}\frac{e(k)}{\vec{x}^T(k)\cdot\vec{x}(k)+\delta(k)}\vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is the step-size diagonal matrix before updating; $\delta(k)$ is a time-varying regularization factor; $\vec{x}(k)$ is a far end received signal vector, and $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; $(k+1)$ is a time index of a signal sample at the moment corresponding to the pre-defined updating period of the step-size diagonal matrix after the pre-learning is ended, and $(k+1-T_0)$ is a positive integer multiple of $T_1$; $T_0$ is the end moment of the pre-learning, and $T_1$ is the pre-defined updating period for updating the step-size diagonal matrix.

Further, the obtaining, based on the coefficient vector of the FIR filter at the updating moment of the step-size diagonal matrix, the estimated value of the attenuation factor of the step-size diagonal matrix of the ES-NLMS algorithm includes: obtaining the estimated value of the attenuation factor according to the following formula $$\hat{\gamma} = \frac{\sum_{i=0}^{L-2}\left\{\frac{h_{i+1}(k)}{h_i(k)}\right\}}{L-1};$$

where $\hat{\gamma}$ is the estimated value of the attenuation factor; $h_i(k)$ is an $(i+1)^{th}$ component of a coefficient vector of the FIR filter at a $k^{th}$ moment; $h_{i+1}(k)$ is an $(i+2)^{th}$ component of the coefficient vector of the FIR filter at the $k^{th}$ moment; i is an index variable of coefficients of the filter, $i=0, 1, 2, \ldots, L-2$, and L is the quantity of the coefficients of the filter; k is the updating moment of the step-size diagonal matrix.

Further, the obtaining, based on the estimated value of the attenuation factor, the updated step-size diagonal matrix of the ES-NLMS algorithm at the updating moment of the step-size diagonal matrix includes: obtaining, the updated step-size diagonal matrix of the ES-NLMS algorithm at the updating moment of the step-size diagonal matrix, according to the following formula $$\hat{A} = \begin{bmatrix} \hat{\alpha}_1 & & & \\ & \hat{\alpha}_2 & & 0 \\ & 0 & \ddots & \\ & & & \hat{\alpha}_L \end{bmatrix};$$

where $\hat{A}$ is the updated step-size diagonal matrix of the ES-NLMS algorithm; $\hat{\alpha}_i$ is an $i^{th}$ element on a main diagonal of the step-size diagonal matrix, and $\hat{\alpha}_i=\alpha\hat{\gamma}^{i-1}$; $\alpha$ is a learning rate constant, and $0<\alpha<2$; $\hat{\gamma}$ is the estimated value of the attenuation factor; i is an index variable of coefficients of the filter, $i=1, 2, \ldots, L$, and L is the quantity of the coefficients of the filter.

Further, the obtaining, based on the updated step-size diagonal matrix, the updated coefficient vector of the FIR filter includes: obtaining the updated coefficient vector of the FIR filter according to the following formula $$\vec{h}(k+1) = \vec{h}(k) + \hat{A}\frac{e(k)}{\vec{x}^T(k)\cdot\vec{x}(k)+\delta(k)}\vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is a step-size diagonal matrix of the ES-NLMS algorithm; $\delta(k)$ is a time-varying regularization factor; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; k is a time index of a signal sample, $k \geq T_0$, and $T_0$ is an end moment of pre-learning.

Further, the manner of obtaining the time-varying regularization factor includes:
obtaining a received signal power of the microphone; and
obtaining, based on the received signal power of the microphone, the time-varying regularization factor.

Further, the obtaining the received signal power of the microphone includes: obtaining the received signal power of the microphone according to the following formula $$\sigma_d^2(k) = \begin{cases} \beta_{attack}\cdot\sigma_d^2(k-1)+(1-\beta_{attack})\cdot|d(k)|^2, & \text{if } |d(k)|^2 > \sigma_d^2(k-1) \\ \beta_{decay}\cdot\sigma_d^2(k-1)+(1-\beta_{decay})\cdot|d(k)|^2, & \text{if } |d(k)|^2 \leq \sigma_d^2(k-1) \end{cases};$$

where $\sigma_d^2(k)$ is the received signal power of the microphone at the $k^{th}$ moment; $\beta_{attack}$ and $\beta_{decay}$ are recursive constants, and $0 \leq \beta_{attack} < \beta_{decay} < 1$; $\sigma_d^2(k-1)$ is a received signal power of the microphone at the $(k-1)^{th}$ moment; $d(k)$ is a received signal of the microphone at the $k^{th}$ moment; $|\cdot|$ is a modulus operator for a complex number; k is a time index of a signal sample.

Further, the obtaining the time-varying regularization factor based on the received signal power of the microphone includes: obtaining the time-varying regularization factor according to the following formula $$\delta(k)=\max\{L\cdot\sigma_d^2(k),\delta_{min}\};$$

where $\delta(k)$ is the time-varying regularization factor at the $k^{th}$ moment; $\sigma_d^2(k)$ is the received signal power of the microphone at the $k^{th}$ moment; $\delta_{min}$ is a pre-defined positive constant; L is the quantity of the coefficients of the filter.

Embodiments of the present disclosure also provide a device for updating a coefficient vector of a finite impulse response (FIR) filter, including a memory, a processor, and a computer program stored in the memory and executable by the processor, where the processor is configured to, when executing the computer program, perform the following steps:
obtaining an updated step-size diagonal matrix for a coefficient vector of the FIR filter; and
obtaining, based on the updated step-size diagonal matrix, an updated coefficient vector of the FIR filter.

Further, the processor is further configured to, when executing the computer program, perform the following steps: updating, based on an end moment of pre-learning and a pre-defined updating period, a step-size diagonal matrix used to update the coefficient vector of the FIR filter, to obtain the updated step-size diagonal matrix.

Further, the processor is further configured to, when executing the computer program, perform the following steps:

obtaining, a coefficient vector of the FIR filter at an updating moment of the step-size diagonal matrix;

obtaining, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and obtaining, based on the estimated value of the attenuation factor, an updated step-size diagonal matrix of the ES-NLMS algorithm at the updating moment of the step-size diagonal matrix.

Further, in a case that the updating moment is the end moment of the pre-learning, the processor is further configured to, when executing the computer program, perform the following steps: obtaining, the coefficient vector of the FIR filter at the end moment of the pre-learning, according to the following formula $$\vec{h}(k+1) = \vec{h}(k) + \alpha \frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\alpha$ is a learning rate constant, and $0<\alpha<2$; $e(k)$ is an error signal at the $k^{th}$ moment; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)=y(k)-\hat{y}(k)+n(k)$; $y(k)$ is an echo signal; $\hat{y}(k)$ is an estimation of the echo signal; $n(k)$ is an ambient noise signal received by a microphone; $\delta(k)$ is a time-varying regularization factor; $(k+1)$ is a time index of a signal sample at the end moment of the pre-learning.

Further, in a case that the updating moment is a moment corresponding to the pre-defined updating period of the step-size diagonal matrix after the pre-learning is ended, the processor is further configured to, when executing the computer program, perform the following steps: obtaining, the coefficient vector of the FIR filter at the moment corresponding to the pre-defined updating period of the step-size diagonal matrix after the pre-learning is ended, according to the following formula $$\vec{h}(k+1) = \vec{h}(k) + \hat{A} \frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is the step-size diagonal matrix before updating; $\delta(k)$ is a time-varying regularization factor; $\vec{x}(k)$ is a far end received signal vector, and $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; $(k+1)$ is a time index of a signal sample at the moment corresponding to the pre-defined updating period of the step-size diagonal matrix after the pre-learning is ended, and $(k+1-T_0)$ is a positive integer multiple of $T_1$; $T_0$ is the end moment of the pre-learning, and $T_1$ is the pre-defined updating period for updating the step-size diagonal matrix.

Further, the processor is further configured to, when executing the computer program, perform the following steps: obtaining the estimated value of the attenuation factor according to the following formula $$\hat{\gamma} = \frac{\sum_{i=0}^{L-2} \left\{ \frac{h_{i+1}(k)}{h_i(k)} \right\}}{L-1};$$

where $\hat{\gamma}$ is the estimated value of the attenuation factor; $h_i(k)$ is an $(i+1)^{th}$ component of a coefficient vector of the FIR filter at a $k^{th}$ moment; $h_{i+1}(k)$ is an $(i+2)^{th}$ component of the coefficient vector of the FIR filter at the $k^{th}$ moment; i is an index variable of coefficients of the filter, $i=0, 1, 2, \ldots, L-2$, and L is the quantity of the coefficients of the filter; k is the updating moment of the step-size diagonal matrix.

Further, the processor is further configured to, when executing the computer program, perform the following steps: obtaining, the updated step-size diagonal matrix of the ES-NLMS algorithm at the updating moment of the step-size diagonal matrix, according to the following formula $$\hat{A} = \begin{bmatrix} \hat{\alpha}_1 & & \\ & \hat{\alpha}_2 & 0 \\ & 0 & \ddots \\ & & \hat{\alpha}_L \end{bmatrix};$$

where $\hat{A}$ is the updated step-size diagonal matrix of the ES-NLMS algorithm; $\hat{\alpha}_i$ is an $i^{th}$ element on a main diagonal of the step-size diagonal matrix, and $\hat{\alpha}_i = \alpha \hat{\gamma}^{i-1}$; $\alpha$ is a learning rate constant, and $0<\alpha<2$; $\hat{\gamma}$ is the estimated value of the attenuation factor; i is an index variable of coefficients of the filter, $i=1, 2, \ldots, L$, and L is the quantity of the coefficients of the filter.

Further, the processor is further configured to, when executing the computer program, perform the following steps: obtaining the updated coefficient vector of the FIR filter according to the following formula $$\vec{h}(k+1) = \vec{h}(k) + \hat{A} \frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is a step-size diagonal matrix of the ES-NLMS algorithm; $\delta(k)$ is a time-varying regularization factor; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n$ (k); y(k) is an echo signal; ŷ(k) is an estimation of the echo signal; n(k) is an ambient noise signal received by a microphone; k is a time index of a signal sample, k≥$T_0$, and $T_0$ is an end moment of pre-learning.

Further, the manner of obtaining the time-varying regularization factor includes:

obtaining a received signal power of the microphone; and obtaining, based on the received signal power of the microphone, the time-varying regularization factor.

Further, the processor is further configured to, when executing the computer program, perform the following steps: obtaining the received signal power of the microphone according to the following formula $$\sigma_d^2(k) =$$
$$\begin{cases} \beta_{attack} \cdot \sigma_d^2(k-1) + (1-\beta_{attack}) \cdot |d(k)|^2, & \text{if } |d(k)|^2 > \sigma_d^2(k-1) \\ \beta_{decay} \cdot \sigma_d^2(k-1) + (1-\beta_{decay}) \cdot |d(k)|^2, & \text{if } |d(k)|^2 \leq \sigma_d^2(k-1) \end{cases};$$

where $\sigma_d^2(k)$ is the received signal power of the microphone at the $k^{th}$ moment; $\beta_{attack}$ and $\beta_{decay}$ are recursive constants, and $0 \leq \beta_{attack} < \beta_{decay} < 1$; $\sigma_d^2(k-1)$ is a received signal power of the microphone at the $(k-1)^{th}$ moment; d(k) is a received signal of the microphone at the $k^{th}$ moment; |·| is a modulus operator for a complex number; k is a time index of a signal sample.

Further, the processor is further configured to, when executing the computer program, perform the following steps: obtain the time-varying regularization factor according to the following formula $$\delta(k) = \max\{L \cdot \sigma_d^2(k), \delta_{min}\};$$

where $\delta(k)$ is the time-varying regularization factor at the $k^{th}$ moment; $\sigma_d^2(k)$ is the received signal power of the microphone at the $k^{th}$ moment; $\delta_{min}$ is a pre-defined positive constant; L is the quantity of the coefficients of the filter.

Embodiments of the present disclosure also provide a computer-readable storage medium, having a computer program stored thereon, where the computer program, when being executed by a processor, performs the steps of the method described above.

Embodiments of the present disclosure also provide a device for updating a coefficient vector of a finite impulse response (FIR) filter, including:

a first obtaining module, configured to obtain an updated step-size diagonal matrix for a coefficient vector of the FIR filter; and a second obtaining module, configured to obtain, based on the updated step-size diagonal matrix, an updated coefficient vector of the FIR filter.

Further, the first obtaining module is configured to: update, based on an end moment of pre-learning and a pre-defined updating period, a step-size diagonal matrix used to update the coefficient vector of the FIR filter, to obtain the updated step-size diagonal matrix.

Further, the first obtaining module includes:

a first obtaining unit, configured to obtain, a coefficient vector of the FIR filter at an updating moment of the step-size diagonal matrix;

a second obtaining unit, configured to obtain, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and a third obtaining unit, configured to obtain, based on the estimated value of the attenuation factor, an updated step-size diagonal matrix of the ES-NLMS algorithm at the updating moment of the step-size diagonal matrix.

Further, in a case that the updating moment is the end moment of the pre-learning, the first obtaining unit is configured to: obtain, the coefficient vector of the FIR filter at the end moment of the pre-learning, according to the following formula $$\vec{h}(k+1) = \vec{h}(k) + \alpha \frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; α is a learning rate constant, and 0<α<2; e(k) is an error signal at the $k^{th}$ moment; $\vec{x}(k)$ is a far end received signal vector, $\vec{x}(k)=[x(k), x(k-1), \ldots, x(k-L+1)]^T$, x(k-n) is a far end received signal at a $(k-n)^{th}$ moment, n=0, 1, . . . , L−1, L is the quantity of coefficients of the filter, and T is a transpose operator; e(k)=y(k)−ŷ(k)+n(k); y(k) is an echo signal; ŷ(k) is an estimation of the echo signal; n(k) is an ambient noise signal received by a microphone; δ(k) is a time-varying regularization factor; (k+1) is a time index of a signal sample at the end moment of the pre-learning.

Further, in a case that the updating moment is a moment corresponding to the pre-defined updating period of the step-size diagonal matrix after the pre-learning is ended, the first obtaining unit is configured to: obtain, the coefficient vector of the FIR filter at the moment corresponding to the pre-defined updating period of the step-size diagonal matrix after the pre-learning is ended, according to the following formula $$\vec{h}(k+1) = \vec{h}(k) + \hat{A}\frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; Â is the step-size diagonal matrix before updating; δ(k) is a time-varying regularization factor; $\vec{x}(k)$ is a far end received signal vector, and $x(k)=[x(k), x(k-1), \ldots, x(k-L+1)]^T$, x(k-n) is a far end received signal at a $(k-n)^{th}$ moment, n=0, 1, . . . , L−1, L is the quantity of coefficients of the filter, and T is a transpose operator; e(k) is an error signal at the $k^{th}$ moment, and e(k)=y(k)−ŷ(k)+n(k); y(k) is an echo signal; ŷ(k) is an estimation of the echo signal; n(k) is an ambient noise signal received by a microphone; (k+1) is a time index of a signal sample at the moment corresponding to the pre-defined updating period of the step-size diagonal matrix after the pre-learning is ended, and (k+1−$T_0$) is a positive integer multiple of $T_1$; $T_0$ is the end moment of the pre-learning, and $T_1$ is the pre-defined updating period for updating the step-size diagonal matrix.

Further, the second obtaining unit is configured to: obtain the estimated value of the attenuation factor according to the following formula $$\hat{\gamma} = \frac{\sum_{i=0}^{L-2}\left\{\frac{h_{i+1}(k)}{h_i(k)}\right\}}{L-1};$$

where $\hat{\gamma}$ is the estimated value of the attenuation factor; $h_i(k)$ is an $(i+1)^{th}$ component of a coefficient vector of the FIR filter at a $k^{th}$ moment; $h_{i+1}(k)$ is an $(i+2)^{th}$ component of the coefficient vector of the FIR filter at the $k^{th}$ moment; i is an index variable of coefficients of the filter, i=0, 1, 2, ..., L−2, and L is the quantity of the coefficients of the filter; k is the updating moment of the step-size diagonal matrix.

Further, the third obtaining unit is configured to: obtain, the updated step-size diagonal matrix of the ES-NLMS algorithm at the updating moment of the step-size diagonal matrix, according to the following formula $$\hat{A} = \begin{bmatrix} \hat{\alpha}_1 & & \\ & \hat{\alpha}_2 & 0 \\ & 0 & \ddots \\ & & & \hat{\alpha}_L \end{bmatrix};$$

where $\hat{A}$ is the updated step-size diagonal matrix of the ES-NLMS algorithm; $\hat{\alpha}_i$ is an $i^{th}$ element on a main diagonal of the step-size diagonal matrix, and $\hat{\alpha}_i=\alpha\hat{\gamma}^{-1}$; $\alpha$ is a learning rate constant, and $0<\alpha<2$; $\hat{\gamma}$ is the estimated value of the attenuation factor; i is an index variable of coefficients of the filter, i=1, L, and L is the quantity of the coefficients of the filter.

Further, the second obtaining module is configured to: obtain the updated coefficient vector of the FIR filter according to the following formula $$\vec{h}(k+1) = \vec{h}(k) + \hat{A}\frac{e(k)}{\vec{x}^T(k)\cdot\vec{x}(k)+\delta(k)}\vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is a step-size diagonal matrix of the ES-NLMS algorithm; $\delta(k)$ is a time-varying regularization factor; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, n=0, 1, ..., L−1, L is the quantity of coefficients of the filter, and T is a transpose operator; e(k) is an error signal at the $k^{th}$ moment, and $e(k)=y(k)-\hat{y}(k)+n(k)$; y(k) is an echo signal; $\hat{y}(k)$ is an estimation of the echo signal; n(k) is an ambient noise signal received by a microphone; k is a time index of a signal sample, $k \geq T_0$, and $T_0$ is an end moment of pre-learning.

Further, the manner of obtaining the time-varying regularization factor includes:

obtaining a received signal power of the microphone; and obtaining, based on the received signal power of the microphone, the time-varying regularization factor.

Further, the manner of obtaining the received signal power of the microphone includes: obtaining the received signal power of the microphone according to the following formula $$\sigma_d^2(k) =$$
$$\begin{cases} \beta_{attack}\cdot\sigma_d^2(k-1)+(1-\beta_{attack})\cdot|d(k)|^2, & \text{if } |d(k)|^2 > \sigma_d^2(k-1) \\ \beta_{decay}\cdot\sigma_d^2(k-1)+(1-\beta_{decay})\cdot|d(k)|^2, & \text{if } |d(k)|^2 \leq \sigma_d^2(k-1) \end{cases};$$

where $\sigma_d^2(k)$ is the received signal power of the microphone at the $k^{th}$ moment; $\beta$ attack and $\beta_{decay}$ are recursive constants, and $0\leq\beta_{attack}<\beta_{decay}<1$; $\sigma_d^2(k-1)$ is a received signal power of the microphone at the $(k-1)^{th}$ moment; d(k) is a received signal of the microphone at the $k^{th}$ moment; |·| is a modulus operator for a complex number; k is a time index of a signal sample.

Further, the manner of obtaining the time-varying regularization factor based on the received signal power of the microphone includes: obtain the time-varying regularization factor according to the following formula $$\delta(k)=\max\{L\cdot\sigma_d^2(k),\delta_{min}\};$$

where $\delta(k)$ is the time-varying regularization factor at the $k^{th}$ moment; $\sigma_d^2(k)$ is the received signal power of the microphone at the $k^{th}$ moment; $\delta_{min}$ is a pre-defined positive constant; L is the quantity of the coefficients of the filter.

The beneficial effects of the present disclosure are as follows.

In the above solutions, the step-size diagonal matrix is updated, and the coefficient vector of the FIR filter is updated based on the updated step-size diagonal matrix, which increases the convergence rate of coefficients of the FIR filter and improves the overall quality of subsystems or modules such as cancellation and suppression of echo, cancellation and suppression of noise and interference, and system identification that are implemented with the FIR adaptive filter technology.

DETAILED DESCRIPTION

In order to facilitate understanding of objects, technical solutions, and advantages of the present disclosure, detailed descriptions of the present disclosure are provided hereinafter with reference to the accompanying drawings and specific embodiments.

Figure 1:
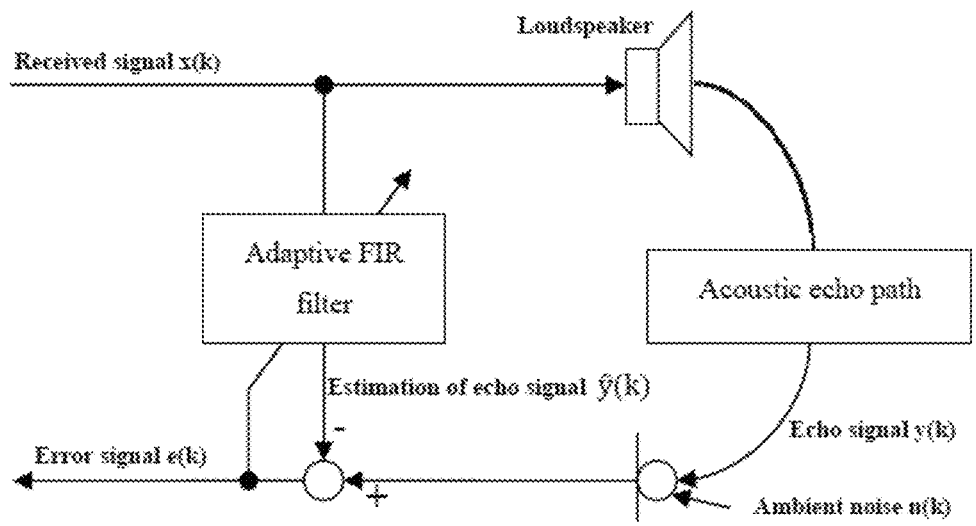
FIG. 1 is a block diagram of an operating principle of acoustic echo cancellation.

The basic operating principle of AEC is shown in FIG. 1. Adaptive iterative updating is usually performed for a coefficient vector $\vec{h}(k)$ of its FIR filter based on a conventional normalized least mean square (Normalized LMS, NLMS) algorithm under a condition of single talk. In a case of double talk, the coefficient vector of the FIR filter $\vec{h}(k)$ stops updating. The conventional NLMS algorithm may be expressed as formula 1.

$$\vec{h}(k+1) = \vec{h}(k) + \alpha \frac{e(k)}{\vec{x}^T(k) \cdot \vec{x}(k) + \delta} \vec{x}(k) \qquad \text{Formula 1}$$

where $\vec{x}(k)$ is expressed as formula 2.

$$\vec{x}(k) \triangleq [x(k), x(k-1), \ldots, x(k-L+1)]^T \qquad \text{Formula 2:}$$

where $\vec{h}(k)$ is expressed as formula 3.

$$\vec{h}(k) \triangleq [h_0(k), h_1(k), \ldots, h_{L-1}(k)]^T \qquad \text{Formula 3:}$$

where e(k) is expressed as formula 4.

$$e(k) \triangleq d(k) - \hat{y}(k) = y(k) - \hat{y}(k) + n(k) \qquad \text{Formula 4:}$$

where L represents the total number of the coefficients of the FIR filter, k represents a time index of a signal sample, δ is a regularization factor greater than zero, and T represents a transpose operation; d(k) is a received signal of a microphone, y(k) is an echo signal in the microphone, $\hat{y}(k) = \vec{x}^T(k) \cdot \vec{h}(k)$ is an estimation of the echo signal, and n(k) is an ambient noise signal received by the microphone; and a is a predetermined updating step-size factor of the coefficients of the FIR filter, which is usually set to be a fixed value between 0 and 2.

The ES-NLMS algorithm may be expressed as formula 5.

$$\vec{h}(k+1) = \vec{h}(k) + A \frac{e(k)}{\vec{x}^T(k) \cdot \vec{x}(k) + \delta} \vec{x}(k) \qquad \text{Formula 5}$$

where A is a step-size diagonal matrix which may be expressed as formula 6.

$$A = \begin{bmatrix} \alpha_1 & & & \\ & \alpha_2 & & 0 \\ & 0 & \ddots & \\ & & & \alpha_L \end{bmatrix} \qquad \text{Formula 6}$$

where $\alpha_i = \alpha_0 \gamma^{i-1}$ (i=1, . . . L), and γ is an exponential attenuation factor (0<γ<1). It can be seen that the conventional ES-NLMS algorithm can simulate the room impulse response to a certain extent, thereby improving the convergence rate of the algorithm.

In order to make the ES-NLMS adaptive learning algorithm have better robustness and maintain a relatively fast convergence rate in a varying calling environment, the present disclosure provides an environment-adaptive sustainable-learning ES-NLMS algorithm used for AEC, which enables coefficients of the FIR filter to converge faster in a complex environment, especially under the condition of double talk, thereby improving the overall effect of echo cancellation. The main idea of the present disclosure includes: using the sustainable-learning NLMS algorithm to perform pre-learning for the operating environment of the FIR filter for a period of time, calculating parameters $\alpha_0$ and γ based on a result of the pre-learning (i.e., a waveform of the coefficient vector of the FIR filter), and constructing a step-size diagonal matrix and applying it to the sustainable-learning ES-NLMS algorithm; then, the parameters $\alpha_0$ and γ need to be recalculated according to the waveform of the coefficient vector of the FIR filter every time a predetermined period elapses, thereby refreshing the step-size diagonal matrix in the sustainable-learning ES-NLMS algorithm.

The sustainable-learning NLMS algorithm adopts a variable regularization factor to overcome the defect of the conventional NLMS algorithm that cooperation of a double talk detector (DTD) is need, so that no DTD is needed and the algorithm can learn sustainably. The algorithm may be expressed as formula 7.

$$\vec{h}(k+1) = \vec{h}(k) + \alpha \frac{e(k)}{\vec{x}^T(k) \cdot \vec{x}(k) + \delta(k)} \vec{x}(k) \qquad \text{Formula 7}$$

where δ(k) is expressed as formula 8.

$$\delta(k) = \max\{L \cdot \sigma_d^2(k), \delta_{min}\} \qquad \text{Formula 8:}$$

Specifically, $\sigma_d^2(k)$ is expressed as formula 9.

Formula 9

$$\sigma_d^2(k) =$$

$$\begin{cases} \beta_{attack} \cdot \sigma_d^2(k-1) + (1 - \beta_{attack}) \cdot |d(k)|^2, & \text{if } |d(k)|^2 > \sigma_d^2(k-1) \\ \beta_{decay} \cdot \sigma_d^2(k-1) + (1 - \beta_{decay}) \cdot |d(k)|^2, & \text{otherwise} \end{cases}$$

where $0 \leq \beta_{attack} < \beta_{decay} < 1$ are recursive constants, d(k) is the received signal of the microphone, and $\delta_{min}$ is a small positive constant. 0<α<2 is a learning rate constant.

At the end moment $T_0$ of the pre-learning, the coefficient vector $\vec{h}(k)$ (in this case, k is the end moment $T_0$ of the pre-learning) of the FIR filter may be used to obtain the step-size diagonal matrix A of the ES-NLMS algorithm. In fact, the element $\alpha_i$ in the step-size diagonal matrix defined by formula 6 may be expressed mathematically as formula 10.

$$\alpha_i = \alpha \gamma^{i-1} \qquad \text{Formula 10:}$$

where i=1, 2, . . . , L.

Then the estimated value $\hat{\gamma}$ of the attenuation factor γ may be calculated based on the coefficient vector $\vec{h}(k)$ of the FIR filter according to the formula 11.

$$\hat{\gamma} = \frac{\sum_{i=0}^{L-2} \left\{ \frac{h_{i+1}(k)}{h_i(k)} \right\}}{L-1} \qquad \text{Formula 11}$$

where $h_i(k)$ is an $(i+1)^{th}$ component of the coefficient vector of the FIR filter at a $k^{th}$ moment.

Therefore, the estimation $\hat{A}$ of the step-size diagonal matrix A may be expressed as formula 12.

$$\hat{A} = \begin{bmatrix} \hat{\alpha}_1 & & & \\ & \hat{\alpha}_2 & & 0 \\ & 0 & \ddots & \\ & & & \hat{\alpha}_L \end{bmatrix} \qquad \text{Formula 12}$$

where $\hat{\alpha}_i$ is expressed as formula 13.

$$\hat{\alpha}_i = \alpha \hat{\gamma}^{i-1} \qquad \text{Formula 13:}$$

Specifically, i=1, 2, . . . , L.

Applying formula 12 to formula 7, the environment-adaptive sustainable-learning ES-NLMS algorithm may be obtained as formula 14.

$$\vec{h}(k+1) = \vec{h}(k) + \hat{A} \frac{e(k)}{\vec{x}^T(k) \cdot \vec{x}(k) + \delta(k)} \vec{x}(k) \qquad \text{Formula 14}$$

where $k \geq T_0$.

The refresh period (i.e., the pre-defined updating period) of matrix $\hat{A}$ in formula 14 is $T_1$. That is, in a case that (the current moment−$T_0$) is an integer multiple of $T_1$, $\vec{h}(k)$ is used to re-estimate $\hat{\gamma}$, and then matrix $\hat{A}$ is refreshed.

According to the above descriptions, the method for updating the coefficient vector of the FIR filter in the embodiments of the present disclosure is specifically described hereinafter.

Figure 2:
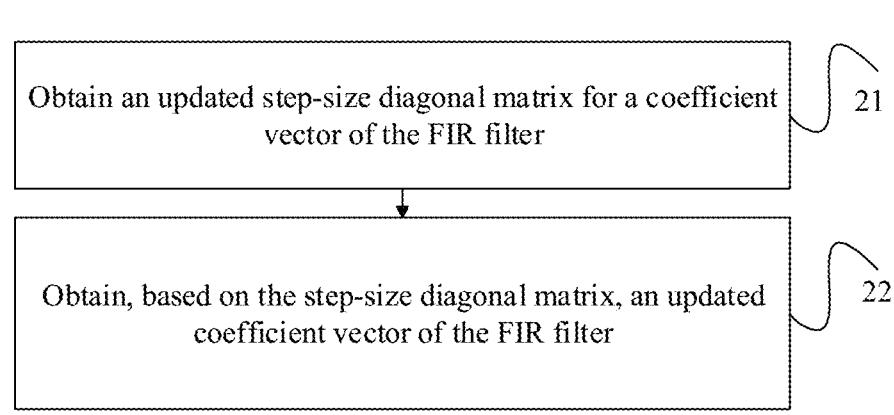
FIG. 2 is a flowchart of a method for updating a coefficient vector of a FIR filter according to embodiments of the present disclosure.

As shown in FIG. 2, the method for updating the coefficient vector of the FIR filter according to the embodiments of the present disclosure includes the following steps.

Step 21 includes: obtaining an updated step-size diagonal matrix for a coefficient vector of the FIR filter.

It should be noted that the specific implementation process of the updating manner of the step-size diagonal matrix includes: updating, based on an end moment of pre-learning and a pre-defined updating period, a step-size diagonal matrix used to update the coefficient vector of the FIR filter, to obtain the updated step-size diagonal matrix.

Step 22 includes: obtaining, based on the step-size diagonal matrix, an updated coefficient vector of the FIR filter.

It should be noted that after the step-size diagonal matrix is updated, it is needed to continue to obtain the coefficient vector of the FIR filter based on the updated step-size diagonal matrix. In this way, update of the coefficient vector of the FIR filter is achieved through update of the step-size diagonal matrix.

Specifically, in step 21, the specific implementation of the updating, based on the end moment of the pre-learning and the pre-defined updating period, the step-size diagonal matrix used to update the coefficient vector of the FIR filter, to obtain the updated step-size diagonal matrix, includes:

obtaining, a coefficient vector of the FIR filter at an updating moment of the step-size diagonal matrix;

obtaining, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and obtaining, based on the estimated value of the attenuation factor, an updated step-size diagonal matrix of the ES-NLMS algorithm at the updating moment of the step-size diagonal matrix.

It should be noted that in order to update the step-size diagonal matrix, the pre-learning of the updating process of the step-size diagonal matrix needs to be performed first. That is, in the pre-learning process, the defining manner of the sustainable-learning NLMS algorithm is adopted to obtain the coefficient vector of the FIR filter. At the end moment (i.e., the moment $T_0$) of the pre-learning, the coefficient vector of the FIR filter at this moment is obtained, and the first updating of the step-size diagonal matrix is performed, based on the coefficient vector of the FIR filter at this moment (i.e., the step-size diagonal matrix which is used for updating the subsequent coefficient vector of the FIR filter for the first time is obtained). Then, the coefficient vector of the FIR filter is calculated based on the step-size diagonal matrix on which the first updating is performed. When the updating moment of the step-size diagonal matrix is reached, the next updating of the step-size diagonal matrix is performed, and the updated step-size diagonal matrix is used to continue the calculation of the coefficient vector of the FIR filter. The operations are in turn performed cyclically, until collection of the voice signal is completed.

It can be seen from the above that the updating moment may be the end moment of the pre-learning, or may be a moment corresponding to the pre-defined updating period of the step-size diagonal matrix after the pre-learning is ended. In these two cases, the manners of obtaining the coefficient vector of the FIR filter may be different. The manner of obtaining the coefficient vector of the FIR filter at the updating moment of the step-size diagonal matrix is specifically described hereinafter from these two aspects.

1. In a case that the updating moment is the end moment of the pre-learning:

specifically, the specific implementation of the obtaining the coefficient vector of the FIR filter at the updating moment of the step-size diagonal matrix includes: obtaining, the coefficient vector of the FIR filter at the end moment of the pre-learning, according to the above formula 7

$$\vec{h}(k+1) = \vec{h}(k) + \alpha \frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\alpha$ is a learning rate constant, and $0<\alpha<2$; $e(k)$ is an error signal at the $k^{th}$ moment; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)=y(k)-\hat{y}(k)+n(k)$; $y(k)$ is an echo signal; $\hat{y}(k)$ is an estimation of the echo signal; $n(k)$ is an ambient noise signal received by a microphone; $\delta(k)$ is a time-varying regularization factor; $(k+1)$ is a time index of a signal sample at the end moment of the pre-learning.

2. In a case that the updating moment is a moment corresponding to the pre-defined updating period of the step-size diagonal matrix after the pre-learning is ended:

specifically, the specific implementation of the obtaining the coefficient vector of the FIR filter at the updating moment of the step-size diagonal matrix includes: obtaining, the coefficient vector of the FIR filter at the moment corresponding to the pre-defined updating period of the step-size diagonal matrix after the pre-learning is ended, according to the above formula 14

$$\vec{h}(k+1) = \vec{h}(k) + \hat{A} \frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is the step-size diagonal matrix before updating; $\delta(k)$ is a time-varying regularization factor; $\vec{x}(k)$ is a far end received signal vector, and $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; $(k+1)$ is a time index of a signal sample at the moment corresponding to the pre-defined updating period of the step-size diagonal matrix after the pre-learning is ended, and $(k+1-T_0)$ is a positive integer multiple of $T_1$; $T_0$ is the end moment of the pre-learning, and $T_1$ is the pre-defined updating period for updating the step-size diagonal matrix.

It should be noted that, the first manner is used to obtain the coefficient vector of the FIR filter for the first updating, and the second manner is used to obtain the coefficient vector of the FIR filter for updating in other cases.

Specifically, the obtaining, based on the coefficient vector of the FIR filter at the updating moment of the step-size diagonal matrix, the estimated value of the attenuation factor of the step-size diagonal matrix of the ES-NLMS algorithm includes: obtaining the estimated value of the attenuation factor according to the above formula 11

$$\hat{\gamma} = \frac{\sum_{i=0}^{L-2}\left\{\frac{h_{i+1}(k)}{h_i(k)}\right\}}{L-1};$$

where $\hat{\gamma}$ is the estimated value of the attenuation factor; $h_i(k)$ is an $(i+1)^{th}$ component of a coefficient vector of the FIR filter at a $k^{th}$ moment; $h_{i+1}(k)$ is an $(i+2)^{th}$ component of the coefficient vector of the FIR filter at the $k^{th}$ moment; i is an index variable of coefficients of the filter, i=0, 1, 2, . . . , L–2, and L is the quantity of the coefficients of the filter; k is the updating moment of the step-size diagonal matrix.

Specifically, the obtaining, based on the estimated value of the attenuation factor, the updated step-size diagonal matrix of the ES-NLMS algorithm at the updating moment of the step-size diagonal matrix includes: obtaining, the updated step-size diagonal matrix of the ES-NLMS algorithm at the updating moment of the step-size diagonal matrix, according to the above formula 12

$$\hat{A} = \begin{bmatrix} \hat{\alpha}_1 & & & \\ & \hat{\alpha}_2 & & 0 \\ & 0 & \ddots & \\ & & & \hat{\alpha}_L \end{bmatrix};$$

where $\hat{A}$ is the updated step-size diagonal matrix of the ES-NLMS algorithm; $\hat{\alpha}_i$ is an $i^{th}$ element on a main diagonal of the step-size diagonal matrix, and $\hat{\alpha}_i = \alpha\hat{\gamma}^{i-1}$; $\alpha$ is a learning rate constant, and $0<\alpha<2$; $\hat{\gamma}$ is the estimated value of the attenuation factor; i is an index variable of coefficients of the filter, i=1, 2, . . . , L, and L is the quantity of the coefficients of the filter.

The subsequent updating process of the step-size diagonal matrix is similar to the first updating, that is, at the updating moment of the step-size diagonal matrix, formula 11 and formula 12 are used repeatedly to obtain the step-size diagonal matrix. Specifically, except for the first updating, other updating moments of the step-size diagonal matrix are determined as follows: determining a moment for which (the current moment—$T_0$) is an integer multiple of T1 as the updating moment of the step-size diagonal matrix, where $T_1$ is the pre-defined updating period of the step-size diagonal matrix.

Specifically, after the updated step-size diagonal matrix is obtained, the manner of the obtaining, based on the step-size diagonal matrix, the updated coefficient vector of the FIR filter includes: obtaining the updated coefficient vector of the FIR filter according to the above formula 14

$$\vec{h}(k+1) = \vec{h}(k) + \hat{A}\frac{e(k)}{\vec{x}^T(k)\cdot\vec{x}(k) + \delta(k)}\vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is a step-size diagonal matrix of the ES-NLMS algorithm; $\delta(k)$ is a time-varying regularization factor; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, n=0, 1, . . . , L–1, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; k is a time index of a signal sample, $k \geq T_0$, and $T_0$ is an end moment of pre-learning.

It should be further explained that the manner of obtaining the time-varying regularization factor includes:

obtaining a received signal power of the microphone; and obtaining, based on the received signal power of the microphone, the time-varying regularization factor.

Specifically, the manner of the obtaining the received signal power of the microphone includes: obtaining the received signal power of the microphone according to the above formula 9

$$\sigma_d^2(k) =$$
$$\begin{cases} \beta_{attack} \cdot \sigma_d^2(k-1) + (1-\beta_{attack}) \cdot |d(k)|^2, & \text{if } |d(k)|^2 > \sigma_d^2(k-1) \\ \beta_{decay} \cdot \sigma_d^2(k-1) + (1-\beta_{decay}) \cdot |d(k)|^2, & \text{if } |d(k)|^2 \leq \sigma_d^2(k-1) \end{cases};$$

where $\sigma_d^2(k)$ is the received signal power of the microphone at the $k^{th}$ moment; $\beta_{attack}$ and $\beta_{decay}$ are recursive constants, and $0 \leq \beta_{attack} < \beta_{decay} < 1$; $\sigma_d^2(k-1)$ is a received signal power of the microphone at the $(k-1)^{th}$ moment; $d(k)$ is a received signal of the microphone at the $k^{th}$ moment; $|\cdot|$ is a modulus operator for a complex number.

Specifically, the manner of the obtaining the time-varying regularization factor based on the received signal power of the microphone includes: obtaining the time-varying regularization factor according to the above formula 8

$$\delta(k) = \max\{L \cdot \sigma_d^2(k), \delta_{min}\};$$

where $\delta(k)$ is the time-varying regularization factor at the $k^{th}$ moment; $\sigma_d^2(k)$ is the received signal power of the microphone at the $k^{th}$ moment; $\delta_{min}$ is a pre-defined positive constant.

Figure 3:
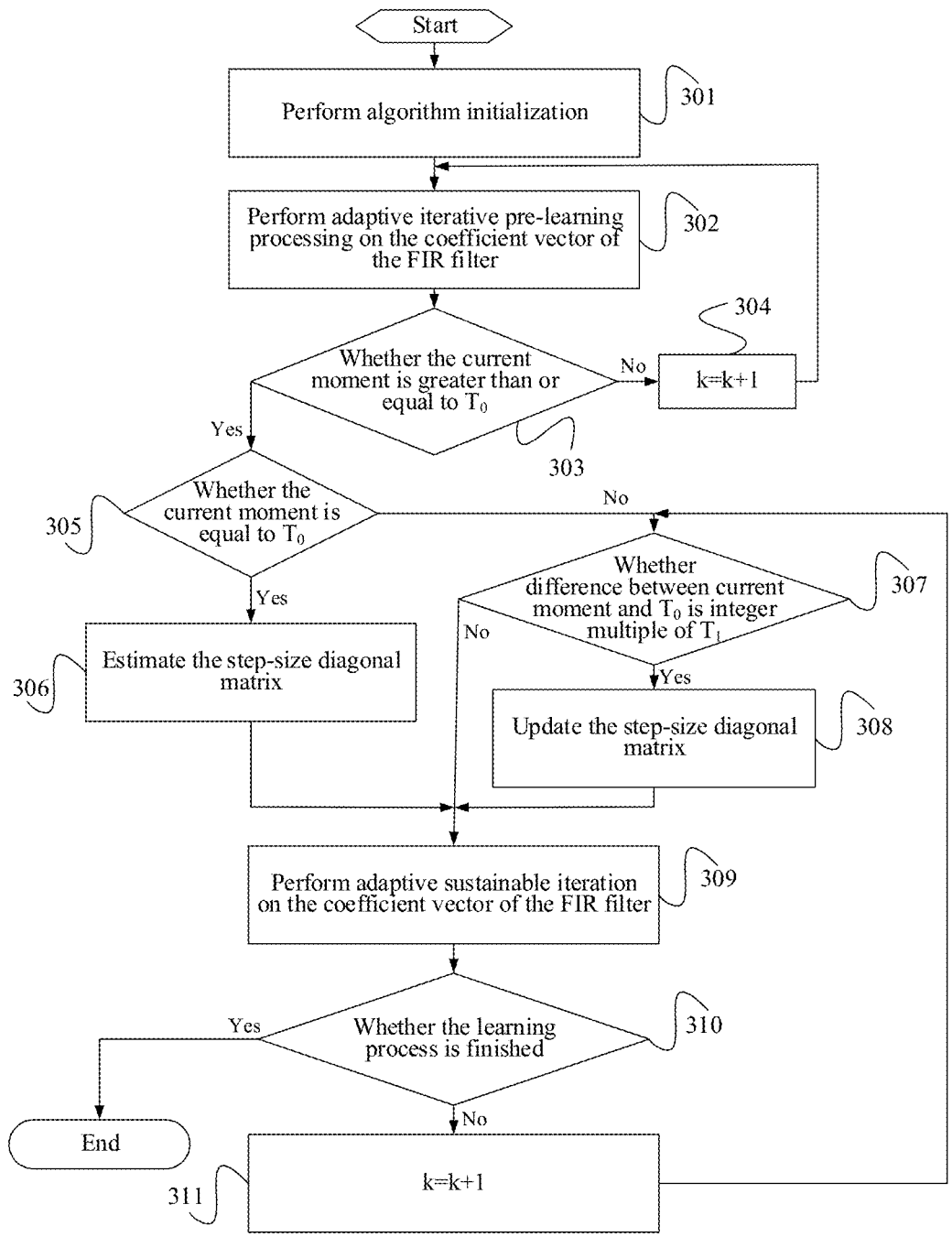
FIG. 3 is a detailed flowchart of a method for updating a coefficient vector of a FIR filter according to embodiments of the present disclosure.

In summary, as shown in FIG. 3, the detailed implementation process of the method for updating the coefficient vector of the FIR filter (that is, the ambient-adaptive time-domain sustainable-fast-learning algorithm used for AEC) according to the present disclosure is as follows.

Step 301 includes: performing algorithm initialization.

Specifically, in this step, parameters that need to be set are as follows:

(1) setting parameters $\alpha$, $\delta_{min}$, and the number L of coefficients of the FIR filter, and setting the end moment $T_0$ of the pre-learning and the pre-defined updating period $T_1$ of the step-size diagonal matrix;

(2) initializing the coefficients of the filter: $h_i(0)=0$, $i=0, 1, 2, \ldots L-1$;

(3) initializing the time index k: k=0.

Step 302 includes: performing adaptive iterative pre-learning processing on the coefficient vector of the FIR filter.

In this step, the above formula 4, and formula 7 to formula 9 are mainly used to obtain the coefficient vector $\vec{h}(k)$ of the FIR filter.

Step 303 includes: determining whether the current moment is greater than or equal to $T_0$; if the current moment is greater than or equal to $T_0$, performing step 305; otherwise, performing step 304.

Step 304 includes: performing operation of k=k+1, and going to step 302, to continue to perform the process of performing adaptive iterative pre-learning processing on the coefficient vector of the FIR filter.

Step 305 includes: determining whether the current moment is equal to $T_0$; if the current moment is equal to $T_0$, performing step 306; otherwise, performing step 307.

Step 306 includes: estimating the step-size diagonal matrix.

In this step, formula 11 to formula 13 are used to perform the first updating of the step-size diagonal matrix.

Step 307 includes: determining whether a difference between the current moment and $T_0$ is an integer multiple of $T_1$; if it is an integer multiple of $T_1$, performing step 308; otherwise, performing step 309.

Step 308 includes: updating the step-size diagonal matrix.

In this step, formula 11 to formula 13 are used to perform subsequent updating of the step-size diagonal matrix.

Step 309 includes: performing adaptive sustainable iteration on the coefficient vector of the FIR filter.

In this step, the above formula 4, formula 8, formula 9 and formula 14 are mainly used to obtain the coefficient vector $\vec{h}(k)$ of the FIR filter.

Step 310 includes: determining whether the learning process is finished; if it is finished, ending the algorithm flow; otherwise, performing step 311.

Step 311 includes: performing operation of k=k+1, and going to step 307, to continue to perform the process of determining whether the difference between the current moment and $T_0$ is an integer multiple of $T_1$.

Through the above implementation process, the coefficient vector of the FIR filter can track changes of the operating environment of AEC in time.

It should be noted that the method for updating the coefficient vector of the FIR filter in the embodiments of the present disclosure is not only applicable to echo canceller (AEC), but also applicable to scenarios such as adaptive system identification and adaptive interference/noise cancellation.

Compared with the conventional methods, the method for updating the coefficient vector of the FIR filter according to the present disclosure has better robustness and can track the statistical characteristic of the response of the echo path in the call system in real time, which increases the convergence rate of the coefficients of the FIR filter and improves the overall quality of subsystems or modules such as cancellation and suppression of echo, cancellation and suppression of noise and interference, and system identification that are implemented with the FIR adaptive filter technology.

Figure 4:
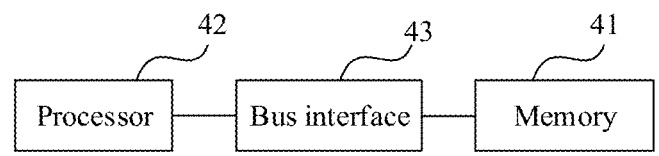
FIG. 4 is a schematic structural diagram of a device for updating a coefficient vector of a FIR filter according to embodiments of the present disclosure.

As shown in FIG. 4, embodiments of the present disclosure also provide a device for updating a coefficient vector of a finite impulse response (FIR) filter, including a memory 41, a processor 42, and a computer program stored in the memory 41 and executable by the processor 42, where the memory 41 is connected to the processor 42 through a bus interface 43, and the processor 42 is configured to, when executing the computer program, perform the following steps:

obtaining an updated step-size diagonal matrix for a coefficient vector of the FIR filter; and obtaining, based on the updated step-size diagonal matrix, an updated coefficient vector of the FIR filter.

Further, the processor may be further configured to, when executing the computer program, perform the following steps:

updating, based on an end moment of pre-learning and a pre-defined updating period, a step-size diagonal matrix used to update the coefficient vector of the FIR filter, to obtain the updated step-size diagonal matrix.

Further, the processor may be further configured to, when executing the computer program, perform the following steps:

obtaining, a coefficient vector of the FIR filter at an updating moment of the step-size diagonal matrix;

obtaining, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and obtaining, based on the estimated value of the attenuation factor, an updated step-size diagonal matrix of the ES-NLMS algorithm at the updating moment of the step-size diagonal matrix.

Further, in a case that the updating moment is the end moment of the pre-learning, the processor may be further configured to, when executing the computer program, perform the following steps: obtaining, the coefficient vector of the FIR filter at the end moment of the pre-learning, according to the following formula $$\vec{h}(k+1) = \vec{h}(k) + \alpha \frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\alpha$ is a learning rate constant, and $0<\alpha<2$; $e(k)$ is an error signal at the $k^{th}$ moment; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)=y(k)-\hat{y}(k)+n(k)$; $y(k)$ is an echo signal; $\hat{y}(k)$ is an estimation of the echo signal; $n(k)$ is an ambient noise signal received by a microphone; $\delta(k)$ is a time-varying regularization factor; $(k+1)$ is a time index of a signal sample at the end moment of the pre-learning.

Further, in a case that the updating moment is a moment corresponding to the pre-defined updating period of the step-size diagonal matrix after the pre-learning is ended, the processor may be further configured to, when executing the computer program, perform the following steps: obtaining, the coefficient vector of the FIR filter at the moment corresponding to the pre-defined updating period of the step-size diagonal matrix after the pre-learning is ended, according to the following formula $$\vec{h}(k+1) = \vec{h}(k) + \hat{A}\frac{e(k)}{\vec{x}^T(k) \cdot \vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is the step-size diagonal matrix before updating; $\delta(k)$ is a time-varying regularization factor; $\vec{x}(k)$ is a far end received signal vector, and $\vec{x}(k)=[x(k), x(k-1), \ldots, x(k-L+1)]^T$, $x(k-n)$ is a far end received signal at a $(k-n)^{th}$ moment, n=0, 1, ..., L-1, L is the quantity of coefficients of the filter, and T is a transpose operator; e(k) is an error signal at the $k^{th}$ moment, and $e(k)=y(k)-\hat{y}(k)+n(k)$; y(k) is an echo signal; $\hat{y}(k)$ is an estimation of the echo signal; n(k) is an ambient noise signal received by a microphone; (k+1) is a time index of a signal sample at the moment corresponding to the pre-defined updating period of the step-size diagonal matrix after the pre-learning is ended, and $(k+1-T_0)$ is a positive integer multiple of $T_1$; $T_0$ is the end moment of the pre-learning, and $T_1$ is the pre-defined updating period for updating the step-size diagonal matrix.

Further, the processor may be further configured to, when executing the computer program, perform the following steps: obtaining the estimated value of the attenuation factor according to the following formula $$\hat{\gamma} = \frac{\sum_{i=0}^{L-2}\left\{\frac{h_{i+1}(k)}{h_i(k)}\right\}}{L-1};$$

where $\hat{\gamma}$ is the estimated value of the attenuation factor; $h_i(k)$ is an $(i+1)^{th}$ component of a coefficient vector of the FIR filter at a $k^{th}$ moment; $h_{i+1}(k)$ is an $(i+2)^{th}$ component of the coefficient vector of the FIR filter at the $k^{th}$ moment; i is an index variable of coefficients of the filter, i=0, 1, 2, ..., L-2, and L is the quantity of the coefficients of the filter; k is the updating moment of the step-size diagonal matrix.

Further, the processor may be further configured to, when executing the computer program, perform the following steps: obtaining, the updated step-size diagonal matrix of the ES-NLMS algorithm at the updating moment of the step-size diagonal matrix, according to the following formula $$\hat{A} = \begin{bmatrix} \hat{\alpha}_1 & & & \\ & \hat{\alpha}_2 & & 0 \\ & 0 & \ddots & \\ & & & \hat{\alpha}_L \end{bmatrix};$$

where A is the updated step-size diagonal matrix of the ES-NLMS algorithm; $\hat{\alpha}_i$ is an $i^{th}$ element on a main diagonal of the step-size diagonal matrix, and $\hat{\alpha}_i = \alpha \hat{\gamma}^{i-1}$; α is a learning rate constant, and 0<α<2; $\hat{\gamma}$ is the estimated value of the attenuation factor; i is an index variable of coefficients of the filter, i=1, 2, ..., L, and L is the quantity of the coefficients of the filter.

Further, the processor may be further configured to, when executing the computer program, perform the following steps: obtaining the updated coefficient vector of the FIR filter according to the following formula $$\vec{h}(k+1) = \vec{h}(k) + \hat{A}\frac{e(k)}{\vec{x}^T(k)\cdot\vec{x}(k) + \delta(k)}\vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is a step-size diagonal matrix of the ES-NLMS algorithm; $\delta(k)$ is a time-varying regularization factor; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, n=0, 1, ..., L-1, L is the quantity of coefficients of the filter, and T is a transpose operator; e(k) is an error signal at the $k^{th}$ moment, and $e(k)=y(k)-\hat{y}(k)+n(k)$; y(k) is an echo signal; $\hat{y}(k)$ is an estimation of the echo signal; n(k) is an ambient noise signal received by a microphone; k is a time index of a signal sample, k≥$T_0$, and $T_0$ is an end moment of pre-learning.

Further, the manner of obtaining the time-varying regularization factor includes:
obtaining a received signal power of the microphone; and
obtaining, based on the received signal power of the microphone, the time-varying regularization factor.

Further, the processor may be further configured to, when executing the computer program, perform the following steps: obtaining the received signal power of the microphone according to the following formula $$\sigma_d^2(k) =$$
$$\begin{cases} \beta_{attack}\cdot\sigma_d^2(k-1) + (1-\beta_{attack})\cdot|d(k)|^2, & \text{if } |d(k)|^2 > \sigma_d^2(k-1) \\ \beta_{decay}\cdot\sigma_d^2(k-1) + (1-\beta_{decay})\cdot|d(k)|^2, & \text{if } |d(k)|^2 \leq \sigma_d^2(k-1) \end{cases};$$

where $\sigma_d^2(k)$ is the received signal power of the microphone at the $k^{th}$ moment; $\beta_{attack}$ and $\beta_{decay}$ are recursive constants, and $0\leq\beta_{attack}<\beta_{decay}<1$; $\sigma_d^2(k-1)$ is a received signal power of the microphone at the $(k-1)^{th}$ moment; d(k) is a received signal of the microphone at the $k^{th}$ moment; |·| is a modulus operator for a complex number; k is a time index of a signal sample.

Further, the processor may be further configured to, when executing the computer program, perform the following steps: obtain the time-varying regularization factor according to the following formula $$\delta(k)=\max\{L\cdot\sigma_d^2(k),\delta_{min}\}$$

where $\delta(k)$ is the time-varying regularization factor at the $k^{th}$ moment; $\sigma_d^2(k)$ is the received signal power of the microphone at the $k^{th}$ moment; $\delta_{min}$ is a pre-defined positive constant; L is the quantity of the coefficients of the filter.

Those skilled in the art can understand that all or part of the steps of the above-mentioned embodiments can be implemented by hardware, or by a computer program instructing relevant hardware. The computer program includes instructions for executing part or all of the steps of the above-mentioned method. The computer program may be stored in a readable storage medium, and the readable storage medium may be any form of storage medium.

Figure 5:
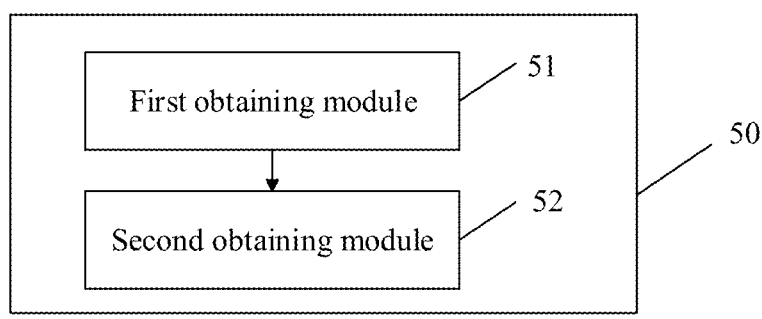
FIG. 5 is a schematic diagram of modules of a device for updating a coefficient vector of a FIR filter according to embodiments of the present disclosure.

As shown in FIG. 5, embodiments of the present disclosure also provide a device 50 for updating a coefficient vector of a finite impulse response (FIR) filter, including:
a first obtaining module 51, configured to obtain an updated step-size diagonal matrix for a coefficient vector of the FIR filter; and
a second obtaining module 52, configured to obtain, based on the updated step-size diagonal matrix, an updated coefficient vector of the FIR filter.

Further, the first obtaining module 51 is configured to:
update, based on an end moment of pre-learning and a pre-defined updating period, a step-size diagonal matrix used to update the coefficient vector of the FIR filter, to obtain the updated step-size diagonal matrix.

Further, the first obtaining module 51 includes:

a first obtaining unit, configured to obtain, a coefficient vector of the FIR filter at an updating moment of the step-size diagonal matrix;

a second obtaining unit, configured to obtain, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and a third obtaining unit, configured to obtain, based on the estimated value of the attenuation factor, an updated step-size diagonal matrix of the ES-NLMS algorithm at the updating moment of the step-size diagonal matrix.

Further, in a case that the updating moment is the end moment of the pre-learning, the first obtaining unit is configured to: obtain, the coefficient vector of the FIR filter at the end moment of the pre-learning, according to the following formula $$\vec{h}(k+1) = \vec{h}(k) + \alpha \frac{e(k)}{\vec{x}^T(k)\cdot\vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\alpha$ is a learning rate constant, and $0<\alpha<2$; $e(k)$ is an error signal at the $k^{th}$ moment; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)=y(k)-\hat{y}(k)+n(k)$; $y(k)$ is an echo signal; $\hat{y}(k)$ is an estimation of the echo signal; $n(k)$ is an ambient noise signal received by a microphone; $\delta(k)$ is a time-varying regularization factor; $(k+1)$ is a time index of a signal sample at the end moment of the pre-learning.

Further, in a case that the updating moment is a moment corresponding to the pre-defined updating period of the step-size diagonal matrix after the pre-learning is ended, the first obtaining unit is configured to: obtain, the coefficient vector of the FIR filter at the moment corresponding to the pre-defined updating period of the step-size diagonal matrix after the pre-learning is ended, according to the following formula $$\vec{h}(k+1) = \vec{h}(k) + \hat{A} \frac{e(k)}{\vec{x}^T(k)\cdot\vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is the step-size diagonal matrix before updating; $\delta(k)$ is a time-varying regularization factor; $\vec{x}(k)$ is a far end received signal vector, and $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; $(k+1)$ is a time index of a signal sample at the moment corresponding to the pre-defined updating period of the step-size diagonal matrix after the pre-learning is ended, and $(k+1-T_0)$ is a positive integer multiple of $T_1$; $T_0$ is the end moment of the pre-learning, and $T_1$ is the pre-defined updating period for updating the step-size diagonal matrix.

Further, the second obtaining unit is configured to: obtain the estimated value of the attenuation factor according to the following formula $$\hat{\gamma} = \frac{\sum_{i=0}^{L-2}\left\{\frac{h_{i+1}(k)}{h_i(k)}\right\}}{L-1};$$

where $\hat{\gamma}$ is the estimated value of the attenuation factor; $h_i(k)$ is an $(i+1)^{th}$ component of a coefficient vector of the FIR filter at a $k^{th}$ moment; $h_{i+1}(k)$ is an $(i+2)^{th}$ component of the coefficient vector of the FIR filter at the $k^{th}$ moment; i is an index variable of coefficients of the filter, $i=0, 1, 2, \ldots, L-2$, and L is the quantity of the coefficients of the filter; k is the updating moment of the step-size diagonal matrix.

Further, the third obtaining unit is configured to: obtain, the updated step-size diagonal matrix of the ES-NLMS algorithm at the updating moment of the step-size diagonal matrix, according to the following formula $$\hat{A} = \begin{bmatrix} \hat{\alpha}_1 & & \\ & \hat{\alpha}_2 & 0 \\ & 0 & \ddots \\ & & & \hat{\alpha}_L \end{bmatrix};$$

where $\hat{A}$ is the updated step-size diagonal matrix of the ES-NLMS algorithm; $\hat{\alpha}_i$ is an $i^{th}$ element on a main diagonal of the step-size diagonal matrix, and $\hat{\alpha}_i = \alpha\hat{\gamma}^{i-1}$; $\alpha$ is a learning rate constant, and $0<\alpha<2$; $\hat{\gamma}$ is the estimated value of the attenuation factor; i is an index variable of coefficients of the filter, $i=1, 2, \ldots, L$, and L is the quantity of the coefficients of the filter.

Further, the second obtaining module 52 is configured to: obtain the updated coefficient vector of the FIR filter according to the following formula $$\vec{h}(k+1) = \vec{h}(k) + \hat{A} \frac{e(k)}{\vec{x}^T(k)\cdot\vec{x}(k) + \delta(k)} \vec{x}(k);$$

where $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is a step-size diagonal matrix of the ES-NLMS algorithm; $\delta(k)$ is a time-varying regularization factor; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; k is a time index of a signal sample, $k \geq T_0$, and $T_0$ is an end moment of pre-learning.

Further, the manner of obtaining the time-varying regularization factor includes:
obtaining a received signal power of the microphone; and
obtaining, based on the received signal power of the microphone, the time-varying regularization factor.

Further, the manner of obtaining the received signal power of the microphone includes: obtaining the received signal power of the microphone according to the following formula $\sigma_d^2(k) =$ $\begin{cases} \beta_{attack} \cdot \sigma_d^2(k-1) + (1-\beta_{attack}) \cdot |d(k)|^2, & \text{if } |d(k)|^2 > \sigma_d^2(k-1) \\ \beta_{decay} \cdot \sigma_d^2(k-1) + (1-\beta_{decay}) \cdot |d(k)|^2, & \text{if } |d(k)|^2 \le \sigma_d^2(k-1) \end{cases}$;

where $\sigma_d^2(k)$ is the received signal power of the microphone at the $k^{th}$ moment; $\beta_{attack}$ and $\beta_{decay}$ are recursive constants, and $0 \le \beta_{attack} < \beta_{decay} < 1$; $\sigma_d^2(k-1)$ is a received signal power of the microphone at the $(k-1)^{th}$ moment; d(k) is a received signal of the microphone at the $k^{th}$ moment; |·| is a modulus operator for a complex number; k is a time index of a signal sample.

Further, the manner of obtaining the time-varying regularization factor based on the received signal power of the microphone includes: obtain the time-varying regularization factor according to the following formula $\delta(k) = \max\{L \cdot \sigma_d^2(k), \delta_{min}\}$;

where $\delta(k)$ is the time-varying regularization factor at the $k^{th}$ moment; $\sigma_d^2(k)$ is the received signal power of the microphone at the $k^{th}$ moment; $\delta_{min}$ is a pre-defined positive constant; L is the quantity of the coefficients of the filter.

It should be noted that the embodiments of the device are in a one-to-one correspondence with the above method embodiments, all the implementations in the above method embodiments are applicable to the embodiments of the device, and the same technical effects can be achieved.

Embodiments of the present disclosure also provide a computer-readable storage medium, having a computer program stored thereon, where the computer program, when being executed by a processor, performs the steps of the method for updating the coefficient vector of the FIR filter.

Optional implementations of the present disclosure are described in the above. It should be noted that for those of ordinary skill in the art, some improvements and modifications can be made without departing from the principle of the present disclosure, and these improvements and modifications fall within the protection scope of the present disclosure.

What is claimed is:

1. A method for updating a coefficient vector of a finite impulse response (FIR) filter, comprising:
obtaining an updated step-size diagonal matrix for a coefficient vector of the FIR filter; and
obtaining, based on the updated step-size diagonal matrix, an updated coefficient vector of the FIR filter;
wherein the obtaining the updated step-size diagonal matrix for the coefficient vector of the FIR filter comprises: updating, based on an end moment of pre-learning and a pre-defined updating period, a step-size diagonal matrix used to update the coefficient vector of the FIR filter, to obtain the updated step-size diagonal matrix;
wherein the updating, based on the end moment of the pre-learning and the pre-defined updating period, the step-size diagonal matrix used to update the coefficient vector of the FIR filter, to obtain the updated step-size diagonal matrix, comprises:
obtaining, a coefficient vector of the FIR filter at an updating moment of the step-size diagonal matrix;
obtaining, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and
obtaining, based on the estimated value of the attenuation factor, an updated step-size diagonal matrix of the ES-NLMS algorithm at the updating moment of the step-size diagonal matrix.

2. The method according to claim 1, wherein in a case that the updating moment is the end moment of the pre-learning, the obtaining the coefficient vector of the FIR filter at the updating moment of the step-size diagonal matrix comprises: obtaining, the coefficient vector of the FIR filter at the end moment of the pre-learning, according to the following formula $\vec{h}(k+1) = \vec{h}(k) + \alpha \frac{e(k)}{\vec{x}^T(k) \cdot \vec{x}(k) + \delta(k)} \vec{x}(k)$;

wherein $\vec{h}(k+1)$ is the coefficient vector of the FIR filter at a $(k+1)^{th}$ moment; $\vec{h}(k)$ is a coefficient vector of the FIR filter at a $k^{th}$ moment; α is a learning rate constant, and $0 < \alpha < 2$; e(k) is an error signal at the $k^{th}$ moment; $\vec{x}(k)$ is a far end received signal vector, $\vec{x}(k)=[x(k), x(k-1), \ldots, x(k-L+1)]^T$, x(k-n) is a far end received signal at a $(k-n)^{th}$ moment, n=0, 1, ..., L-1, L is the quantity of coefficients of the filter, and T is a transpose operator; $e(k)=y(k)-\hat{y}(k)+n(k)$; y(k) is an echo signal; $\hat{y}(k)$ is an estimation of the echo signal; n(k) is an ambient noise signal received by a microphone; δ(k) is a time-varying regularization factor; (k+1) is a time index of a signal sample at the end moment of the pre-learning.

3. The method according to claim 1, wherein in a case that the updating moment is a moment corresponding to the pre-defined updating period of the step-size diagonal matrix after the pre-learning is ended, the obtaining the coefficient vector of the FIR filter at the updating moment of the step-size diagonal matrix comprises: obtaining, the coefficient vector of the FIR filter at the moment corresponding to the pre-defined updating period of the step-size diagonal matrix after the pre-learning is ended, according to the following formula $\vec{h}(k+1) = \vec{h}(k) + \hat{A} \frac{e(k)}{\vec{x}^T(k) \cdot \vec{x}(k) + \delta(k)} \vec{x}(k)$;

wherein $\vec{h}(k+1)$ is the coefficient vector of the FIR filter at a $(k+1)^{th}$ moment; $\vec{h}(k)$ is a coefficient vector of the FIR filter at a $k^{th}$ moment; Â is the step-size diagonal matrix before updating; δ(k) is a time-varying regularization factor; $\vec{x}(k)$ is a far end received signal vector, and $\vec{x}(k)=[x(k), x(k-1), \ldots, x(k-L+1)]^T$, x(k-n) is a far end received signal at a $(k-n)^{th}$ moment, $n=0, 1, \ldots, L-1$, L is the quantity of coefficients of the filter, and T is a transpose operator; e(k) is an error signal at the $k^{th}$ moment, and $e(k)=y(k)-\hat{y}(k)+n(k)$; y(k) is an echo signal; $\hat{y}(k)$ is an estimation of the echo signal; n(k) is an ambient noise signal received by a microphone; (k+1) is a time index of a signal sample at the moment corresponding to the pre-defined updating period of the step-size diagonal matrix after the pre-learning is ended, and $(k+1-T_0)$ is a positive integer multiple of $T_1$; $T_0$ is the end moment of the pre-learning, and $T_1$ is the pre-defined updating period for updating the step-size diagonal matrix.

4. The method according to claim 1, wherein the obtaining, based on the coefficient vector of the FIR filter at the updating moment of the step-size diagonal matrix, the estimated value of the attenuation factor of the step-size diagonal matrix of the ES-NLMS algorithm comprises: obtaining the estimated value of the attenuation factor according to the following formula $$\hat{\gamma} = \frac{\sum_{i=0}^{L-2}\left\{\frac{h_{i+1}(k)}{h_i(k)}\right\}}{L-1};$$

wherein $\hat{\gamma}$ is the estimated value of the attenuation factor; $h_i(k)$ is an $(i+1)^{th}$ component of a coefficient vector of the FIR filter at a $k^{th}$ moment; $h_{i+1}(k)$ is an $(i+2)^{th}$ component of the coefficient vector of the FIR filter at the $k^{th}$ moment; i is an index variable of coefficients of the filter, $i=0, 1, 2, \ldots, L-2$, and L is the quantity of the coefficients of the filter; k is the updating moment of the step-size diagonal matrix.

5. The method according to claim 1, wherein the obtaining, based on the estimated value of the attenuation factor, the updated step-size diagonal matrix of the ES-NLMS algorithm at the updating moment of the step-size diagonal matrix comprises: obtaining, the updated step-size diagonal matrix of the ES-NLMS algorithm at the updating moment of the step-size diagonal matrix, according to the following formula $$\hat{A} = \begin{bmatrix} \hat{\alpha}_1 & & \\ & \hat{\alpha}_2 & 0 \\ & 0 & \ddots \\ & & & \hat{\alpha}_L \end{bmatrix};$$

wherein $\hat{A}$ is the updated step-size diagonal matrix of the ES-NLMS algorithm; $\hat{\alpha}_i$ is an $i^{th}$ element on a main diagonal of the step-size diagonal matrix, and $\hat{\alpha}_i = \alpha \hat{\gamma}^{i-1}$; $\alpha$ is a learning rate constant, and $0<\alpha<2$; $\hat{\gamma}$ is the estimated value of the attenuation factor; i is an index variable of coefficients of the filter, $i=1, 2, \ldots, L$, and L is the quantity of the coefficients of the filter.

6. The method according to claim 1, wherein the obtaining, based on the updated step-size diagonal matrix, the updated coefficient vector of the FIR filter comprises: obtaining the updated coefficient vector of the FIR filter according to the following formula $$\vec{h}(k+1) = \vec{h}(k) + \hat{A}\frac{e(k)}{\vec{x}^T(k)\cdot\vec{x}(k) + \delta(k)}\vec{x}(k);$$

wherein $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is a step-size diagonal matrix of the ES-NLMS algorithm; $\delta(k)$ is a time-varying regularization factor; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; e(k) is an error signal at the $k^{th}$ moment, and $e(k)=y(k)-\hat{y}(k)+n(k)$; y(k) is an echo signal; $\hat{y}(k)$ is an estimation of the echo signal; n(k) is an ambient noise signal received by a microphone; k is a time index of a signal sample, $k \geq T_0$, and $T_0$ is an end moment of pre-learning.

7. The method according to claim 2, wherein the manner of obtaining the time-varying regularization factor comprises:
obtaining a received signal power of the microphone; and
obtaining, based on the received signal power of the microphone, the time-varying regularization factor.

8. The method according to claim 7, wherein the obtaining the received signal power of the microphone comprises: obtaining the received signal power of the microphone according to the following formula $$\sigma_d^2(k) = \begin{cases} \beta_{attack}\cdot\sigma_d^2(k-1) + (1-\beta_{attack})\cdot|d(k)|^2, & \text{if } |d(k)|^2 > \sigma_d^2(k-1) \\ \beta_{decay}\cdot\sigma_d^2(k-1) + (1-\beta_{decay})\cdot|d(k)|^2, & \text{if } |d(k)|^2 \leq \sigma_d^2(k-1) \end{cases};$$

wherein $\sigma_d^2(k)$ is the received signal power of the microphone at the $k^{th}$ moment; $\beta_{attack}$ and $\beta_{decay}$ are recursive constants, and $0 \leq \beta_{attack} < \beta_{decay} < 1$; $\sigma_d^2(k-1)$ is a received signal power of the microphone at the $(k-1)^{th}$ moment; d(k) is a received signal of the microphone at the $k^{th}$ moment; $|\cdot|$ is a modulus operator for a complex number; k is a time index of a signal sample.

9. The method according to claim 7, wherein the obtaining the time-varying regularization factor based on the received signal power of the microphone comprises: obtaining the time-varying regularization factor according to the following formula $$\delta(k) = \max\{L\cdot\sigma_d^2(k), \delta_{min}\};$$

wherein $\delta(k)$ is the time-varying regularization factor at the $k^{th}$ moment; $\sigma_d^2(k)$ is the received signal power of the microphone at the $k^{th}$ moment; $\delta_{min}$ is a pre-defined positive constant; L is the quantity of the coefficients of the filter.

10. A device for updating a coefficient vector of a finite impulse response (FIR) filter, comprising a memory, a processor, and a computer program stored in the memory and executable by the processor, wherein the processor is configured to, when executing the computer program, perform the following steps:
obtaining an updated step-size diagonal matrix for a coefficient vector of the FIR filter; and
obtaining, based on the updated step-size diagonal matrix, an updated coefficient vector of the FIR filter;
wherein the processor is further configured to, when executing the computer program, perform the following steps: updating, based on an end moment of pre-learning and a pre-defined updating period, a step-size diagonal matrix used to update the coefficient vector of the FIR filter, to obtain the updated step-size diagonal matrix;

wherein the processor is further configured to, when executing the computer program, perform the following steps:

obtaining, a coefficient vector of the FIR filter at an updating moment of the step-size diagonal matrix;

obtaining, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and obtaining, based on the estimated value of the attenuation factor, an updated step-size diagonal matrix of the ES-NLMS algorithm at the updating moment of the step-size diagonal matrix.

11. The device according to claim 10, wherein in a case that the updating moment is the end moment of the pre-learning, the processor is further configured to, when executing the computer program, perform the following steps: obtaining, the coefficient vector of the FIR filter at the end moment of the pre-learning, according to the following formula $$\vec{h}(k+1) = \vec{h}(k) + \alpha \frac{e(k)}{\vec{x}^T(k)\cdot\vec{x}(k) + \delta(k)}\vec{x}(k);$$

wherein $\vec{h}(k+1)$ is the coefficient vector of the FIR filter at a $(k+1)^{th}$ moment; $\vec{h}(k)$ is a coefficient vector of the FIR filter at a $k^{th}$ moment; $\alpha$ is a learning rate constant, and $0<\alpha<2$; $e(k)$ is an error signal at the $k^{th}$ moment; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)=y(k)-\hat{y}(k)+n(k)$; $y(k)$ is an echo signal; $\hat{y}(k)$ is an estimation of the echo signal; $n(k)$ is an ambient noise signal received by a microphone; $\delta(k)$ is a time-varying regularization factor; $(k+1)$ is a time index of a signal sample at the end moment of the pre-learning.

12. The device according to claim 10, wherein in a case that the updating moment is a moment corresponding to the pre-defined updating period of the step-size diagonal matrix after the pre-learning is ended, the processor is further configured to, when executing the computer program, perform the following steps: obtaining, the coefficient vector of the FIR filter at the moment corresponding to the pre-defined updating period of the step-size diagonal matrix after the pre-learning is ended, according to the following formula $$\vec{h}(k+1) = \vec{h}(k) + \hat{A}\frac{e(k)}{\vec{x}^T(k)\cdot\vec{x}(k) + \delta(k)}\vec{x}(k);$$

wherein $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is the step-size diagonal matrix before updating; $\delta(k)$ is a time-varying regularization factor; $\vec{x}(k)$ is a far end received signal vector, and $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; $(k+1)$ is a time index of a signal sample at the moment corresponding to the pre-defined updating period of the step-size diagonal matrix after the pre-learning is ended, and $(k+1-T_0)$ is a positive integer multiple of $T_1$; $T_0$ is the end moment of the pre-learning, and $T_1$ is the pre-defined updating period for updating the step-size diagonal matrix.

13. The device according to claim 10, wherein the processor is further configured to, when executing the computer program, perform the following steps: obtaining the estimated value of the attenuation factor according to the following formula $$\hat{\gamma} = \frac{\sum_{i=0}^{L-2}\left\{\frac{h_{i+1}(k)}{h_i(k)}\right\}}{L-1};$$

wherein $\hat{\gamma}$ is the estimated value of the attenuation factor; $h_i(k)$ is an $(i+1)^{th}$ component of a coefficient vector of the FIR filter at a $k^{th}$ moment; $h_{i+i}(k)$ is an $(i+2)^{th}$ component of the coefficient vector of the FIR filter at the $k^{th}$ moment; i is an index variable of coefficients of the filter, i=0, 1, 2, ..., L−2, and L is the quantity of the coefficients of the filter; k is the updating moment of the step-size diagonal matrix.

14. The device according to claim 10, wherein the processor is further configured to, when executing the computer program, perform the following steps: obtaining, the updated step-size diagonal matrix of the ES-NLMS algorithm at the updating moment of the step-size diagonal matrix, according to the following formula $$\hat{A} = \begin{bmatrix} \hat{\alpha}_1 & & \\ & \hat{\alpha}_2 & 0 \\ & 0 & \ddots \\ & & & \hat{\alpha}_L \end{bmatrix};$$

wherein $\hat{A}$ is the updated step-size diagonal matrix of the ES-NLMS algorithm; $\hat{\alpha}_i$ is an $i^{th}$ element on a main diagonal of the step-size diagonal matrix, and $\hat{\alpha}_i=\alpha\hat{\gamma}^{i-1}$; $\alpha$ is a learning rate constant, and $0<\alpha<2$; $\hat{\gamma}$ is the estimated value of the attenuation factor; i is an index variable of coefficients of the filter, i=1, 2, ... L, and L is the quantity of the coefficients of the filter.

15. The device according to claim 10, wherein the processor is further configured to, when executing the computer program, perform the following steps: obtaining the updated coefficient vector of the FIR filter according to the following formula $$\vec{h}(k+1) = \vec{h}(k) + \hat{A}\frac{e(k)}{\vec{x}^T(k)\cdot\vec{x}(k) + \delta(k)}\vec{x}(k);$$

wherein $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is a step-size diagonal matrix of the ES-NLMS algorithm; $\delta(k)$ is a time-varying regularization factor; $\vec{x}(k)$ is a far end received signal vector, $\vec{x}(k)=[x(k), x(k-1), \ldots x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; k is a time index of a signal sample, $k \geq T_0$, and $T_0$ is an end moment of pre-learning.

16. A non-transitory computer-readable storage medium, having a computer program stored thereon, wherein the computer program, when being executed by a processor, performs the following steps:
   obtaining an updated step-size diagonal matrix for a coefficient vector of the FIR filter; and
   obtaining, based on the updated step-size diagonal matrix, an updated coefficient vector of the FIR filter;
   wherein the obtaining the updated step-size diagonal matrix for the coefficient vector of the FIR filter comprises: updating, based on an end moment of pre-learning and a pre-defined updating period, a step-size diagonal matrix used to update the coefficient vector of the FIR filter, to obtain the updated step-size diagonal matrix;
   wherein the updating, based on the end moment of the pre-learning and the pre-defined updating period, the step-size diagonal matrix used to update the coefficient vector of the FIR filter, to obtain the updated step-size diagonal matrix, comprises:
   obtaining, a coefficient vector of the FIR filter at an updating moment of the step-size diagonal matrix;
   obtaining, based on the coefficient vector of the FIR filter at the updating moment of the step-size diagonal matrix, an estimated value of an attenuation factor of a step-size diagonal matrix of an exponentially weighted step-size normalized least mean square (ES-NLMS) algorithm; and
   obtaining, based on the estimated value of the attenuation factor, an updated step-size diagonal matrix of the ES-NLMS algorithm at the updating moment of the step-size diagonal matrix.

17. The non-transitory computer-readable storage medium according to claim 16, wherein in a case that the updating moment is the end moment of the pre-learning, the obtaining the coefficient vector of the FIR filter at the updating moment of the step-size diagonal matrix comprises: obtaining, the coefficient vector of the FIR filter at the end moment of the pre-learning, according to the following formula $$\vec{h}(k+1) = \vec{h}(k) + \alpha \frac{e(k)}{\vec{x}^T(k) \cdot \vec{x}(k) + \delta(k)} \vec{x}(k);$$

wherein $\vec{h}(k+1)$ is the coefficient vector of the FIR filter at a $(k+1)^{th}$ moment; $\vec{h}(k)$ is a coefficient vector of the FIR filter at a $k^{th}$ moment; $\alpha$ is a learning rate constant, and $0<\alpha<2$; $e(k)$ is an error signal at the $k^{th}$ moment; $\vec{x}(k)$ is a far end received signal vector, $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)=y(k)-\hat{y}(k)+n(k)$; $y(k)$ is an echo signal; $\hat{y}(k)$ is an estimation of the echo signal; $n(k)$ is an ambient noise signal received by a microphone; $\delta(k)$ is a time-varying regularization factor; $(k+1)$ is a time index of a signal sample at the end moment of the pre-learning.

18. The non-transitory computer-readable storage medium according to claim 16, wherein in a case that the updating moment is a moment corresponding to the pre-defined updating period of the step-size diagonal matrix after the pre-learning is ended, the obtaining the coefficient vector of the FIR filter at the updating moment of the step-size diagonal matrix comprises: obtaining, the coefficient vector of the FIR filter at the moment corresponding to the pre-defined updating period of the step-size diagonal matrix after the pre-learning is ended, according to the following formula $$\vec{h}(k+1) = \vec{h}(k) + \hat{A} \frac{e(k)}{\vec{x}^T(k) \cdot \vec{x}(k) + \delta(k)} \vec{x}(k);$$

wherein $\vec{h}(k+1)$ is the coefficient vector of the FIR filter at a $(k+1)^{th}$ moment; $\vec{h}(k)$ is a coefficient vector of the FIR filter at a $k^{th}$ moment; $\hat{A}$ is the step-size diagonal matrix before updating; $\delta(k)$ is a time-varying regularization factor; $\vec{x}(k)$ is a far end received signal vector, and $\vec{x}(k)=[x(k), x(k-1), \ldots, x(k-L+1)]^T$, $x(k-n)$ is a far end received signal at a $(k-n)^{th}$ moment, $n=0, 1, \ldots, L-1$, L is the quantity of coefficients of the filter, and T is a transpose operator; $e(k)$ is an error signal at the $k^{th}$ moment, and $e(k)=y(k)-\hat{y}(k)+n(k)$; $y(k)$ is an echo signal; $\hat{y}(k)$ is an estimation of the echo signal; $n(k)$ is an ambient noise signal received by a microphone; $(k+1)$ is a time index of a signal sample at the moment corresponding to the pre-defined updating period of the step-size diagonal matrix after the pre-learning is ended, and $(k+1-T_0)$ is a positive integer multiple of $T_1$; $T_0$ is the end moment of the pre-learning, and $T_1$ is the pre-defined updating period for updating the step-size diagonal matrix.

19. The non-transitory computer-readable storage medium according to claim 16, wherein the obtaining, based on the coefficient vector of the FIR filter at the updating moment of the step-size diagonal matrix, the estimated value of the attenuation factor of the step-size diagonal matrix of the ES-NLMS algorithm comprises: obtaining the estimated value of the attenuation factor according to the following formula $$\hat{\gamma} = \frac{\sum_{i=0}^{L-2} \left\{ \frac{h_{i+1}(k)}{h_i(k)} \right\}}{L-1};$$

wherein $\hat{\gamma}$ is the estimated value of the attenuation factor; $h_i(k)$ is an $(i+1)^{th}$ component of a coefficient vector of the FIR filter at a $k^{th}$ moment; $h_{i+1}(k)$ is an $(i+2)^{th}$ component of the coefficient vector of the FIR filter at the $k^{th}$ moment; i is an index variable of coefficients of the filter, $i=0, 1, 2, \ldots, L-2$, and L is the quantity of the coefficients of the filter; k is the updating moment of the step-size diagonal matrix.

20. The non-transitory computer-readable storage medium according to claim 16, wherein the obtaining, based on the estimated value of the attenuation factor, the updated step-size diagonal matrix of the ES-NLMS algorithm at the updating moment of the step-size diagonal matrix comprises: obtaining, the updated step-size diagonal matrix of the ES-NLMS algorithm at the updating moment of the step-size diagonal matrix, according to the following formula $$\hat{A} = \begin{bmatrix} \hat{\alpha}_1 & & & \\ & \hat{\alpha}_2 & & 0 \\ & 0 & \ddots & \\ & & & \hat{\alpha}_L \end{bmatrix};$$

wherein $\hat{A}$ is the updated step-size diagonal matrix of the ES-NLMS algorithm; $\hat{\alpha}_i$ is an $i^{th}$ element on a main diagonal of the step-size diagonal matrix, and $\hat{\alpha}_i = \alpha \hat{\gamma}^{-1}$; $\alpha$ is a learning rate constant, and $0 < \alpha < 2$; $\hat{\gamma}$ is the estimated value of the attenuation factor; i is an index variable of coefficients of the filter, i=1, 2, . . . L, and L is the quantity of the coefficients of the filter.

* * * * *